(12) United States Patent
Mahnkopf et al.

(10) Patent No.: US 10,535,578 B2
(45) Date of Patent: Jan. 14, 2020

(54) SEMICONDUCTOR DEVICES, AND A METHOD FOR FORMING A SEMICONDUCTOR DEVICE

(71) Applicant: Intel IP Corporation, Santa Clara, CA (US)

(72) Inventors: Reinhard Mahnkopf, Oberhaching (DE); Andreas Wolter, Regensburg (DE); Sonja Koller, Regensburg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/719,653

(22) Filed: Sep. 29, 2017

(65) Prior Publication Data

US 2019/0103333 A1  Apr. 4, 2019

(51) Int. Cl.
| | | |
|---|---|---|
| H01L 21/48 | (2006.01) | |
| H01L 23/367 | (2006.01) | |
| H01L 27/02 | (2006.01) | |
| H01L 23/498 | (2006.01) | |
| H01L 21/762 | (2006.01) | |
| H01L 27/12 | (2006.01) | |
| H01L 23/373 | (2006.01) | |
| H01L 25/065 | (2006.01) | |
| H01L 21/84 | (2006.01) | |

(52) U.S. Cl.
CPC ........ *H01L 23/367* (2013.01); *H01L 21/4803* (2013.01); *H01L 21/7624* (2013.01); *H01L 23/4985* (2013.01); *H01L 27/0207* (2013.01); *H01L 27/1203* (2013.01); *H01L 21/84* (2013.01); *H01L 23/3736* (2013.01); *H01L 25/0652* (2013.01)

(58) Field of Classification Search
CPC ............. H01L 27/1203; H01L 23/4985; H01L 21/7624
See application file for complete search history.

(56) References Cited

U.S. PATENT DOCUMENTS

| | | | | |
|---|---|---|---|---|
| 6,242,967 B1* | 6/2001 | Iwamuro | ............. | H01L 27/0623 257/E27.015 |
| 6,417,027 B1* | 7/2002 | Akram | ................ | H01L 23/5387 257/724 |
| 7,022,556 B1* | 4/2006 | Adachi | .................. | G03B 27/00 438/149 |
| 2015/0084128 A1* | 3/2015 | Gambino | ................ | H01L 23/34 257/347 |
| 2015/0162307 A1* | 6/2015 | Chen | .................. | H01L 23/3672 257/712 |
| 2017/0162675 A1* | 6/2017 | Yim | .................... | H01L 21/0217 |
| 2018/0226348 A1* | 8/2018 | Hsieh | .................. | H01L 23/5387 |

* cited by examiner

*Primary Examiner* — Kenneth Parker
*Assistant Examiner* — Long H Le
(74) *Attorney, Agent, or Firm* — 2SPL Patent Attorneys PartG mbB

(57) ABSTRACT

A semiconductor device includes a plurality of circuit regions formed at a circuit semiconductor layer of a semiconductor die. The semiconductor device includes an etch stop layer of the semiconductor die arranged between the circuit semiconductor layer of the semiconductor die and a handling layer of the semiconductor die. The semiconductor device includes one or more trench structures extending through the handling layer of the semiconductor die. The one or more trench structures extends to at least the etch stop layer and to at most the circuit semiconductor layer of the semiconductor die.

19 Claims, 10 Drawing Sheets

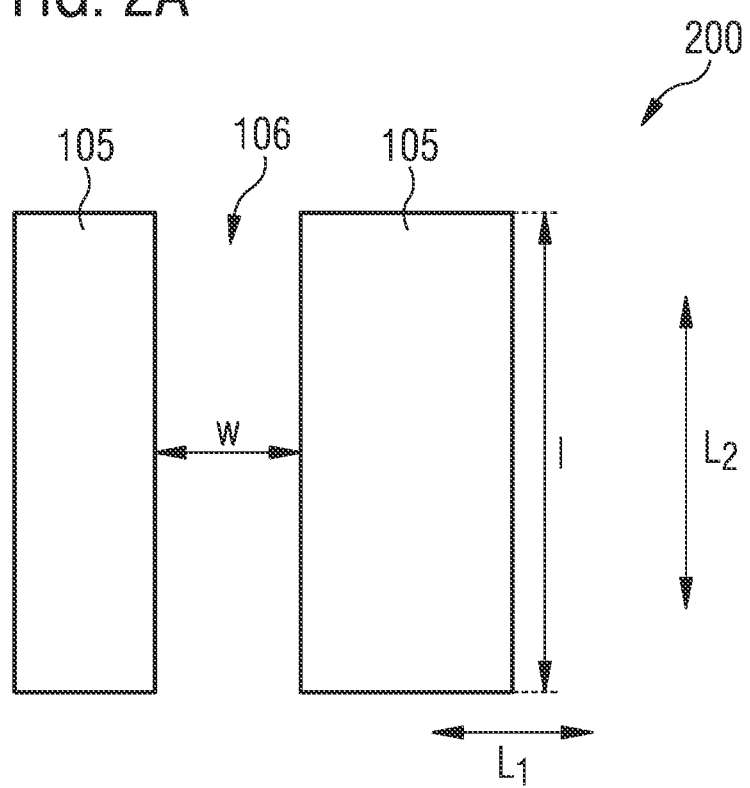

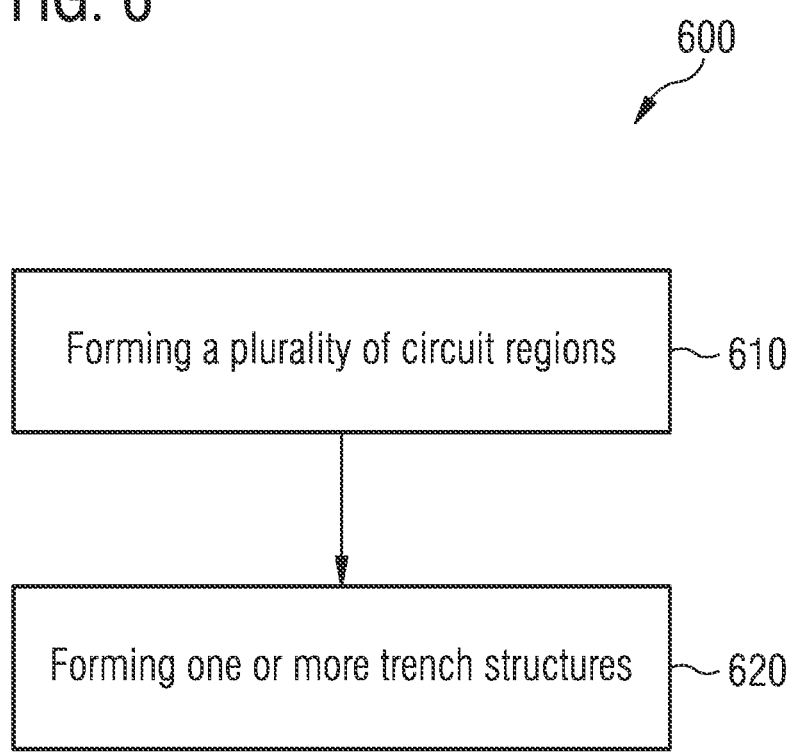

SEMICONDUCTOR DEVICES, AND A METHOD FOR FORMING A SEMICONDUCTOR DEVICE

TECHNICAL FIELD

Examples relate to concepts for improving heat dissipation and/or for increasing flexibility in semiconductor devices, and in particular to semiconductor devices and a method for forming a semiconductor device.

BACKGROUND

In electronic semiconductor circuits, power may be dissipated and thermal heat may be generated. Circuits in some technologies, e.g. power amplifiers, may generate heat which may need to be dissipated efficiently. Particularly in power device circuits, regions of increased heat intensity (e.g. hot-spot regions) may be generated in an on-state of the power device. Overheating of the semiconductor circuit may cause semiconductor devices to malfunction or to be destroyed. Efficient heat dissipation from the semiconductor circuit may be needed to prevent overheating.

BRIEF DESCRIPTION OF THE FIGURES

Some examples of apparatuses and/or methods will be described in the following by way of example only, and with reference to the accompanying figures, in which

FIGS. 2A to 2C show schematic top view illustrations of various trench structures;

FIG. 6 shows a flow chart of a method for forming a semiconductor device; and

DETAILED DESCRIPTION

Figure 1A:
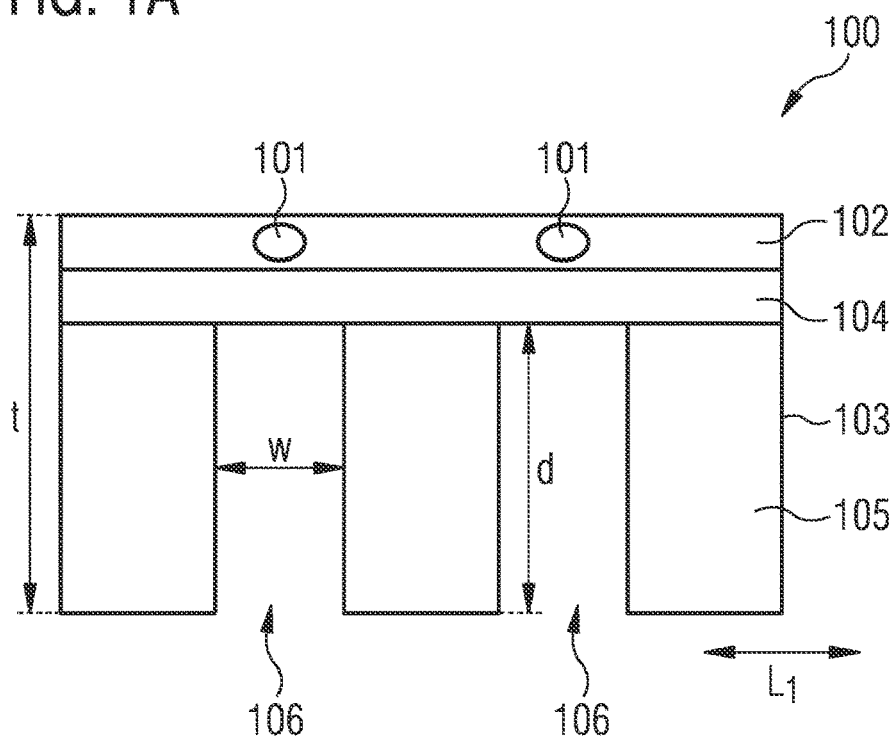
FIG. 1A shows a schematic illustration of a side view of a semiconductor device.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices may be embedded in packages to provide protection against impact and corrosion, to hold the contact pins or leads and/or to dissipate heat produced by the device, for example. A semiconductor package may include one or more semiconductor components. Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package may protect the semiconductor die against the ingress of moisture, for example. Similarly, non-semiconductor electrical components (e.g. resistors, capacitors, inductors) may be arranged in packages.

FIG. 1A shows a schematic illustration of a cross-sectional side view of a semiconductor device 100.

The semiconductor device 100 comprises a plurality of circuit regions 101 formed at a circuit semiconductor layer 102 of a semiconductor die 103. The semiconductor device 100 further comprises an etch stop layer 104 of the semiconductor die 103 arranged between the circuit semiconductor layer 102 of the semiconductor die 103 and a handling layer 105 of the semiconductor die 103. The semiconductor device 100 further comprises one or more trench structures 106 extending through the handling layer 105 of the semiconductor die 103. The one or more trench structures 106 extends to at least the etch stop layer 104 and to at most the circuit semiconductor layer 102 of the semiconductor die 103.

Due to the forming of the one or more trench structures 106 extending to at least the etch stop layer 104 and to at most the circuit semiconductor layer 102 of the semiconductor die 103, the one or more trench structures 106 may function as heat dissipation structures, configured to dissipate (e.g. transfer, and/or e.g. remove) heat from the circuit semiconductor layer 102. Due to the close proximity between the heat dissipating trench structures 106 and circuit structures in the circuit regions 101 of the semiconductor device 100, improved heat dissipation away from the semiconductor device 100 may be achieved. Additionally or optionally, the one or more trench structures 106 may alter the mechanical properties (e.g. bendability) of the semiconductor die 103. Thus, the one or more trench structures 106 may cause the semiconductor die 103 to be a bendable semiconductor die 103, thus increasing the range of applications in which the semiconductor die 103 may be implemented.

The circuit semiconductor layer 102 may be a layer of the semiconductor die 103 in which and/or at which circuit structures are formed. The circuit semiconductor layer 102 (the semiconductor top layer) may be a layer of the semiconductor die 103 at a front side of the semiconductor die 103. The semiconductor die 103 may be part of a semiconductor wafer. The semiconductor die 103 may be a silicon-on-insulator (SOI) die, for example.

The circuit semiconductor layer 102 may include the plurality of circuit regions 101 and a plurality of intervening regions. A (or each) circuit region 101 of the circuit semiconductor layer 102 may be located between consecutive (or neighboring) intervening region of the circuit semiconductor layer 102. Additionally or optionally, a (or each) intervening region of the circuit semiconductor layer 102 may be located between consecutive (or neighboring) circuit regions 101 of the circuit semiconductor layer 102. For example, an intervening region may be a portion (or space) of the circuit semiconductor layer 102 between adjacent (hot spot) circuit regions 101. For example, the plurality of circuit regions 101 and the plurality of intervening regions may be arranged in alternating sequence in at least one lateral direction (e.g. a first lateral direction, L1). The circuit regions 101 of the plurality of circuit regions 101 may be the regions of the circuit semiconductor layer conducting a high current density during an on-state of the semiconductor device 100. The intervening regions of the plurality of intervening regions may conduct a low current density during the on-state of the semiconductor device 100. For example, the high current density conducted in an (or each) circuit regions during the on-state may be more than 5 times larger (or e.g. more than 10 times larger) than a current density conducted in an intervening region during the on-state. A plurality of hot spot regions (heated regions) may be generated by the plurality of circuit regions 101 during a transistor on-state. For example, due to the higher current density conducted in the plurality of circuit regions 101, the circuit regions (and/or regions of the circuit semiconductor layer 102 directly surrounding the circuit regions may become hot spots (e.g. they may become overheated, or e.g. may reach a temperature higher than a temperature threshold value. Due to the higher current density (e.g. at least 1 A per cm$^2$, or e.g. at least 2 A per cm$^2$) conducted by the circuit structures in the plurality of circuit regions 101, at least 2 times more heat may be generated by the circuit structures at (or in) a circuit region 101 than by the circuit structures (e.g. interconnects, and/or low power semiconductor structures) located at (or in) an intervening region. The heat from the hot spots generated by the circuits may need to be dissipated in order to prevent the semiconductor device 100 from malfunctioning.

Optionally, additionally or alternatively, the circuit regions 101 of the plurality of circuit regions 101 may have a high transistor structure density and the intervening regions of the plurality of intervening regions may have a low transistor structure density. Optionally, the transistor structures may be but are not limited to being power transistor structures. For example, a larger number of transistor structures may be located in the circuit regions 101 of the plurality of circuit regions 101 than in the intervening regions of the plurality of intervening regions. For example, the number of transistors structures located in the circuit regions 101 of the plurality of circuit regions 101 may be more than 2 times larger (or e.g. more than 3 times larger, or e.g. more than 5 times larger) than the number of transistor structures in the intervening regions of the plurality of intervening regions. Optionally, all the transistor structures (e.g. power transistors) of the semiconductor device 100 may be located in the plurality of circuit regions 101 and no transistor structures may be located in the plurality of intervening regions. For example, an intervening region may be a portion of the circuit semiconductor layer 102 between adjacent (hot spot) circuit regions 101.

An average thickness of the circuit semiconductor layer 102 of the semiconductor die 103 may be between a few nanometers to a few hundreds of nanometers or a few micrometers. For example, the average thickness of the circuit semiconductor layer 102 may be between 5 nm and 10 µm (or e.g. between 20 nm and 3 µm, or e.g. between 30 nm and 2 µm). Additionally or optionally, a maximal (largest) thickness of the circuit semiconductor layer 102 of the semiconductor die 103 may be less than 10 µm (or e.g. less than 3 µm, or e.g. less than 2 µm). The circuit semiconductor layer 102 may include (or may be) a semiconductor substrate material layer. The semiconductor substrate material layer 102 may be a silicon-based semiconductor substrate material layer (e.g. a silicon substrate or a silicon carbide (SiC)-based semiconductor substrate). Alternatively, or optionally, the semiconductor substrate material layer 102 may be a gallium arsenide (GaAs)-based semiconductor substrate, a gallium nitride (GaN)-based semiconductor substrate material layer, a Germanium (Ge)-based semiconductor substrate material, or any III-V or II-VI semiconductor material.

The circuit structures formed in the circuit semiconductor layer 102 may be complementary metal oxide semiconductor (CMOS) field effect transistor structures and/or bipolar transistors or any other active circuit element, for example. Optionally, the circuit structures formed in the circuit semiconductor layer 102 may include (or may be) power transistor structures (e.g. power metal oxide semiconductor field effect transistor (MOSFET) structures, e.g. power insulated gate bipolar transistor (IGBT) structures, and/or e.g. double-diffused metal oxide semiconductor (DMOS) transistor structures) and/or power diode structures. The operating voltage (e.g. breakdown voltage and/or e.g. blocking voltage) of a power circuit structure may be more than 10V (or e.g. more than 100 V, or e.g. more than 500 V), for example. The operating voltage (e.g. breakdown voltage and/or e.g. blocking voltage) of a power amplifier (PA) circuit structure for low voltage radio frequency cellular applications may be less than 5V, for example.

The semiconductor die 103 may further include the etch stop layer 104 (e.g. a buried oxide BOX layer) of the semiconductor die 103. The etch stop layer 104 of the semiconductor die 103 may be arranged directly between the circuit semiconductor layer 102 of the semiconductor die 103 and the handling layer 105 of the semiconductor die 103. In the case of the semiconductor die 103 being an SOI die, the etch stop layer 104 of the semiconductor die 103 may be an insulator layer (e.g. a buried oxide BOX layer) of the SOI die 103. The insulator layer may be a silicon dioxide layer, for example. An average thickness of the etch stop layer 104 of the semiconductor die 103 may be between a few tens of nanometers to a few hundreds of nanometers or a few micrometers. For example, the average thickness of the etch stop layer 104 may be between 20 nm and 5 µm (or e.g. between 100 nm and 3 µm, or e.g. between 500 nm and 2 µm). Additionally or optionally, a maximal (largest) thickness of the etch stop layer 104 of the semiconductor die 103 may be less than 5 µm (or e.g. less than 3 µm, or e.g. less than 2 µm).

The handling layer 105 of the semiconductor die 103 may be a semiconductor substrate material layer which may optionally be the same material as the circuit semiconductor layer 102. Optionally or alternatively the handling layer 105 may be the same material as the circuit semiconductor layer 102, but with a different crystal orientation and/or a different base resistivity. Optionally or alternatively the handling layer 105 may be a different material from the circuit semiconductor layer 102. For example, alternatively, the handling layer 105 may be a glass layer. An average thickness of the handling layer 105 of the semiconductor die 103 may range from a few tens of micrometers to a few hundreds of micrometers. For example, the average thickness of the handling layer 105 before grinding may be between 100 µm and 1000 µm (or e.g. between 100 µm and 500 µm, or e.g. between 100 µm and 300 µm). For example, the average thickness of the handling layer 105 after grinding may be between 20 µm and 800 µm (or e.g. between 20 µm and 500 µm, or e.g. between 20 µm and 300 µm).

Figure 1B:
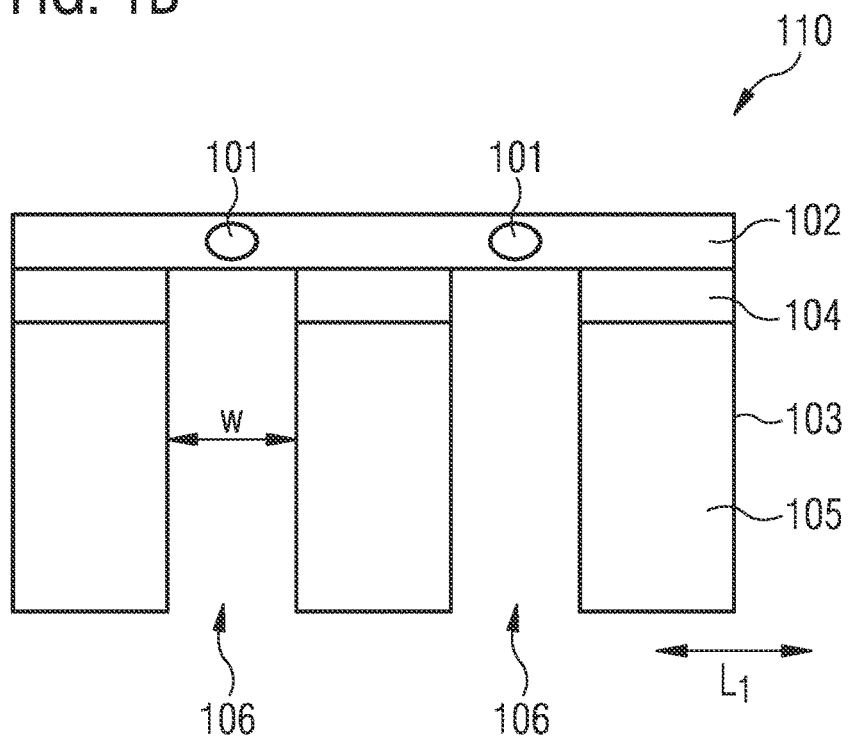
FIG. 1B shows a schematic illustration of a side view of a further semiconductor device.

The one or more trench structures 106 may be column-shaped cavity structures extending vertically from a back side (or back surface) of the semiconductor die 103, and through the handling layer 105 towards the circuit semiconductor layer 102 at the front side of the semiconductor die 103. The one or more trench structures may be arranged in a regular pattern beneath the circuit semiconductor region. For example, the one or more trench structures may be a single column or an array of columns horizontally located at the circuit semiconductor region. The one or more trench structures 106 extends to at least the etch stop layer 104 and to at most the circuit semiconductor layer 102 of the semiconductor die 103. Such column-shaped cavity structures may optionally have a rectangular shape in a cross-sectional side view of the semiconductor die 103. Alternatively, other shapes of the column-shaped cavity structures are possible. The cavity structures may be of different shape depending on the process used for creating them. For example, the side walls of the edges need not to be at right angle to the etch stop layer 104. For example, the cavity structures may have beveled sidewalls. For example, the bottoms (or bottoms walls) of the one or more trench structures 106 may extend to (or e.g. reach, or e.g. expose) at least the etch stop layer 104 as shown in FIG. 1A. Alternatively, the bottoms of the one or more trench structures 106 may extend to at most an interface surface between the etch stop layer 104 and the circuit semiconductor layer 102 as shown in FIG. 1B. Thus, the one or more trench structures 106 do not extend vertically beyond or above other layers which may be formed at the front side of the semiconductor die 103. For example, the one or more trench structures 106 do not extend to any further layers (e.g. further front side insulation layers, and/or e.g. further front side metallization layer) formed on (or e.g. on top of, or e.g. adjacent to) the circuit semiconductor layer 102. Thus, at least a part of the circuit semiconductor layer 102 may be located vertically between the bottoms of the one or more trench structures 106 and any further layers adjacent to (or above) the circuit semiconductor layer 102.

A cross sectional side view of the semiconductor die 103 shows the one or more trench structures 106 having or including a plurality of trenches 106. The one or more trench structures 106 may be (or may refer to) a plurality of trench structures 106 or one trench structure 106, for example. It may be possible that a single trench structure 106 may have a meandering profile in a top view of the semiconductor die 103. However, the single trench structure 106 may nevertheless have a plurality of trenches in a cross-sectional side view of the semiconductor die 103. In the cross-sectional side view of the semiconductor die 103, the trenches 106 of the plurality of trenches 106 may be located between portions of the handling layer 105 remaining after the forming of the one or more trench structures 106.

A minimal lateral dimension (or width, w) at the bottom of the one or more trench structures 106 may be larger than 1 µm (or e.g. larger than 5 µm, or e.g. larger than 8 µm). For example, the minimal lateral dimension of the one or more trench structures 106 may be between 1 µm and 100 µm, (or e.g. between 1 µm and 5 µm). A minimal (or smallest) depth, d, of the one or more trench structures 106 may be larger than 50% (or e.g. larger than 20%, or e.g. larger than 40%) of an average thickness, t, of the semiconductor die 103. For example, the minimal depth of the one or more trench structures 106 may be larger than 10 µm (or e.g. larger than 15 µm, or e.g. larger than 100 µm). Optionally, the aspect ratio (e.g. depth to width ratio) of a trench structure may be up to 20:1 or 25:1.

In some examples, the plurality of trenches of the one or more trench structures 106 may be arranged at locations in the handling layer 105 corresponding to locations of the plurality of circuit regions 101 at (or in) the circuit semiconductor layer 102 of the semiconductor die 103. For example, the plurality of trenches are not arbitrarily (or randomly formed), but instead, they may be arranged in locations based on the locations of the plurality of circuit regions 101 at the circuit semiconductor layer 102. The plurality of trenches 106 may be arranged at locations in the handling layer 105 so that a bottom of each trench of the plurality of trenches laterally overlaps a lateral area of a circuit region 101 of the plurality of circuit regions 101. The lateral area of the circuit region 101 may be a lateral area of the circuit semiconductor layer 102 where at least one semiconductor structure (e.g. a transistor structure and/or a diode) is formed. The lateral area of the semiconductor die 103 occupied by the device region may refer to the amount of surface area (from a top view) taken up by the one or more power semiconductor structures in the circuit region 101. Optionally, the number of trenches may be at least half (or equal to) the number of plurality of circuit regions 101 of the circuit semiconductor layer 102.

The lateral overlap between the plurality of circuit regions 101 and the plurality of trenches 106, and in addition, the extending of the one or more trench structures 106 to at least the etch stop layer 104 and to at most the circuit semiconductor layer 102, may lead to a close proximity between the plurality of trenches 106 and the plurality of circuit regions 101. For example, a vertical distance between a bottom of a trench 106 of the plurality of trenches and a gate of a transistor structure formed in a circuit region 101 which lateral overlaps the trench 106 may be less than 1 µm (or e.g. less than 500 nm, or e.g. less than 200 nm). If the semiconductor layer 102 is ultra-thin body, the vertical distance may be less than 10 nm.

Optionally or additionally, thermally conductive filler material may be arranged in the one or more trench structures 106. A thermal conductivity of the thermally conductive filler material may be at least 2 (or e.g. at least 3 times) larger than a thermal conductivity of the handling layer 105 of the semiconductor die 103. The thermally conductive filler material may include a metal or a liquid. In examples of the thermally conductive filler material being a liquid, the thermally conductive filler material may be water or an oil-based liquid. In examples of the thermally conductive filler material being a metal, the thermally conductive filler material may include at least one metal from the following group of metals, the group of metals consisting of: tungsten, aluminum, gold, titanium and copper, or any other metal or any combination of these materials or any combination of these materials and other metals. Furthermore, the semiconductor device 100 may further include a barrier layer arranged on vertical sidewalls and/or on the bottom wall of the one or more trench structures 106. The metal-based thermally conductive filler material may be arranged on (or e.g. adjacent to) the barrier layer.

Due to the plurality of trenches 106 being formed at the locations in the handling layer 105 corresponding to locations of the plurality of circuit regions 101 in the circuit semiconductor layer 102, heat from hot spots generated by the circuit structures in the plurality of circuit regions 101 during the transistor on-state may be dissipated more easily than if no trenches 106 were formed in the handling layer 105. The one or more trench structures 106 may function as effective thermal heat sinks which are arranged within the semiconductor die 103 in close proximity to the circuit structures.

Alternatively, the plurality of trenches 106 of the one or more trench structures 106 may be arranged at locations in the handling layer 105 corresponding to locations of the plurality of intervening regions at the circuit semiconductor layer 102 of the semiconductor die 103. For example, the plurality of trenches 106 may be arranged at locations in the handling layer 105 so that a bottom of each trench 106 of the plurality of trenches laterally overlaps a lateral area of an intervening region of the plurality of intervening regions. The number of trenches 160 may be at least half the number of plurality of intervening regions at the circuit semiconductor layer 102. In these examples, if the one or more trench structures 106 are left unfilled (or e.g. filled with air, nitrogen or a noble gas) or are filled with elastic material instead of metal, the semiconductor die 103 becomes a bendable (flexible) semiconductor die 103.

The bendable semiconductor die 103 may be configured such that an angle between a lateral surface (e.g. a back surface) of a first region of the circuit semiconductor layer 102 and a lateral surface of a second region of the circuit semiconductor layer 102 may be adjustable from less than 180° to larger than 180°. Additionally, the bendable semiconductor die 103 may be configured such that an angle between a lateral surface of the second region of the circuit semiconductor layer 102 and a lateral surface of a third region of the circuit semiconductor layer 102 may be adjustable from less than 180° to larger than 180°.

Figure 5A:
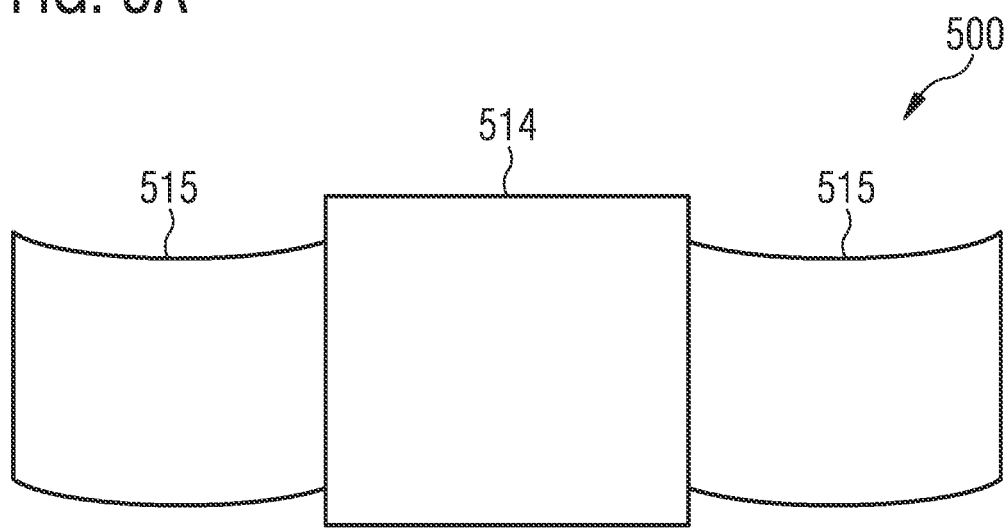
FIGS. 5A to 5B show schematic top view and side view illustrations of a wearable semiconductor device.
Figure 5B:
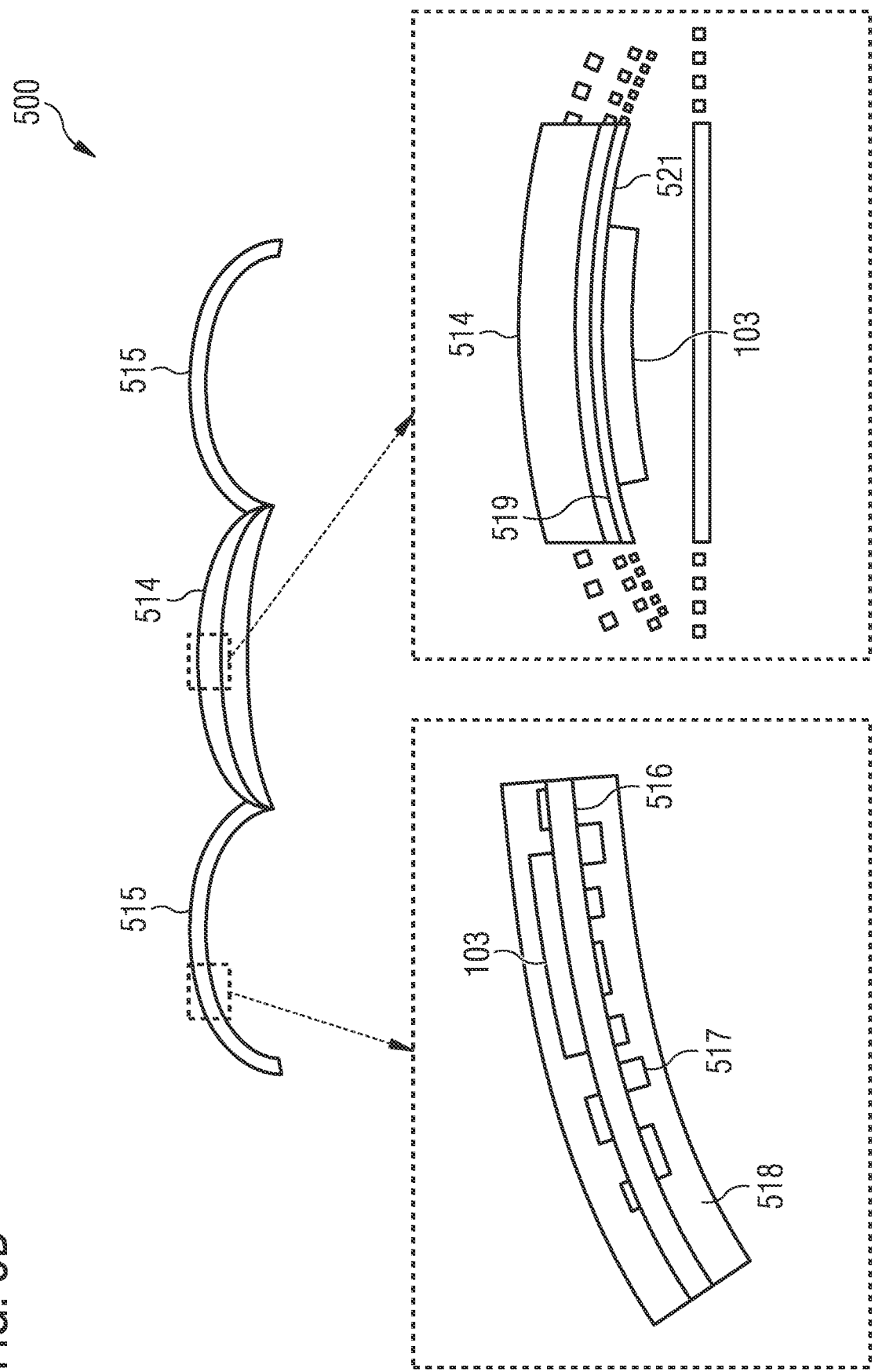

In some examples, the semiconductor device 100 may further include a curved or flexible carrier substrate (as shown in FIG. 5B). The carrier substrate may be a stiff and curved carrier substrate, or it may be a flexible (bendable) carrier substrate. If the semiconductor die 103 were bendable, the bendable semiconductor die 103 may be arranged on (e.g. adhered to, or e.g. fixed to, or e.g. mounted to) a concave or convex surface of the curved or flexible carrier substrate. Optionally, the curved or flexible carrier substrate may be a printed circuit board.

The semiconductor die 103 may be connected to a surface of the curved or flexible carrier substrate via a first surface (e.g. a front surface or e.g. a back surface) of the semiconductor die 103, for example. The semiconductor device 100 may further include a flexible cover structure covering at least the opposite second surface of the semiconductor die 103. The flexible cover structure may include (or may be, or may be formed predominantly from) an elastic material (e.g. an elastic rubber material). Thus, the entire semiconductor device 100 may be a flexible, bendable semiconductor package.

The semiconductor device 100 may be a wearable device and/or a display device, for example (as shown in FIG. 5B). A first group of semiconductor dies 103 may be implemented in the display portion (e.g. a stiff curved portion, or e.g. a flexible curved portion) of the semiconductor device, and, a second group of semiconductor dies 103 may be implanted in the wearable bendable portion of the semiconductor device. Thus, the semiconductor device 100 may include a plurality of semiconductor dies 103 connected to the curved or flexible carrier substrate. The flexible cover structure may cover at least the second surfaces of the plurality of semiconductor dies 103 as well.

A lateral surface of the semiconductor die 103 may be a substantially even plane (e.g. neglecting unevenness of the semiconductor structure due to the manufacturing process and trenches). An aspect ratio between a thickness (vertical dimension) and a lateral dimension of the semiconductor die 103 may range from between 1 and 1000, for example. The vertical edges of the semiconductor die 103 may be the edges resulting from individualizing or dicing the semiconductor die 103. The lateral surface may be substantially perpendicular (or orthogonal) to the vertical edges of the semiconductor die 103 (ignoring manufacturing tolerances). For example, in comparison to a (substantially vertical or orthogonal) edge of the semiconductor die 103, the lateral surface may be a basically horizontal surface extending laterally.

A lateral dimension, lateral distance or lateral length of the semiconductor die 103 may be a dimension or distance measured in a direction substantially horizontal to (and/or parallel to) the lateral surface of the semiconductor die 103. Additionally, a lateral direction may be a direction substantially horizontal to (and/or parallel to) the lateral surface of the semiconductor die 103. A vertical dimension, vertical distance or vertical length of the semiconductor die 103 may be a dimension or distance measured in a direction substantially perpendicular to the lateral surface of the semiconductor die 103.

A front lateral surface of the semiconductor die 103 may be a surface of the semiconductor substrate die towards metal layers, insulation layers and/or passivation layers on top of the semiconductor substrate die or a surface of one of these layers. For example, a semiconductor substrate die front side may be the side at which active elements of the chip are formed. For example, in a semiconductor die of some power semiconductor devices, a chip (or semiconductor substrate) front side may be a side of the chip at which a first source/drain region and a gate region are formed, and a chip (or semiconductor substrate) back side may be a side of the chip at which a second source/drain region is formed. For example, more complex structures may be arranged at the chip front side than at the chip back side.

In electronic semiconductor circuits power may be dissipated and thermal heat may be generated. In some semiconductor technologies there may be insulating layer in the wafer substrate/handling wafer, e.g. a buried oxide (box) in silicon on insulator (SOI) technologies. Circuits in these technologies, e.g. power amplifiers, may generate heat which needs to be dissipated efficiently. The various examples thus describes the generation of structures from the backside of the wafer for extremely efficient heat dissipation by establishing an intimate heat sink to the semiconductor hot spots.

The various examples may be applied to all (or any) semiconductor-on insulator technologies. From the backside of the wafer, structures of any shape may be etched into the handling wafer/silicon all the way through the wafer to the oxide (buried oxide). The oxide may act as a very effective etch stop layer, in close vertical distance to the top material in which the electrical circuits are generating heat during operation. In a second process, even the buried oxide may be etched away with the semiconductor top material as an etch stop layer then. A material with high thermal conductivity may be deposited inside the etched structures to generate a heat sink. In this arrangement an intimate contact may be realized between the hot spots where heat is generated during device operation and the heat sink directly underneath. The patterned structures may have any shape, and may be filled with any metal, left unfilled or even used for liquid cooling schemes, for example.

Using an SOI semiconductor die 103 wafer may allow for better heat dissipation from the semiconductor die to be achieved. It may otherwise be challenging to arrange such an intimate contact to the hot spot in semiconductor technologies without having an isolating layer in the wafer substrate, since processes do not allow such precise controls for processing/etching processes without the etch-stop-layers. The remaining physical vertical distance to the hot spot would be much higher which would limit the effectiveness as heat sink, compared to the distances to the hot spots achieved using SOI wafers. As shown in FIGS. 1A and 1B, the electrical circuit structures may generate heat and build hot spots. This heat would need to be dissipated to allow proper reliable electrical functionality, for example. The thermal heat sinks formed by the one or more trench structures 106 may be brought into the vicinity of the device. The closer the trench structures 106 are to the hot spots, the better heat the dissipation achieved.

FIG. 1B shows a schematic illustration of a cross-sectional side view of a semiconductor device 110. The semiconductor device 110 may be similar to the semiconductor device 100. For example, the semiconductor device 110 may include one or more or all of the features of the semiconductor device 100.

However, instead of the one or more trench structures 106 extending only to the etch stop layer 104, the one or more trench structures 106 extend through both the handling layer 105 and the etch stop layer 104. Thus, the one or more trench structures 106 extend to the circuit semiconductor layer 102, for example. The bottoms of the one or more trench structures 106 reach an interface between the etch stop layer 104 and the circuit semiconductor layer 102, exposing the circuit semiconductor layer 102.

Figure 2B:
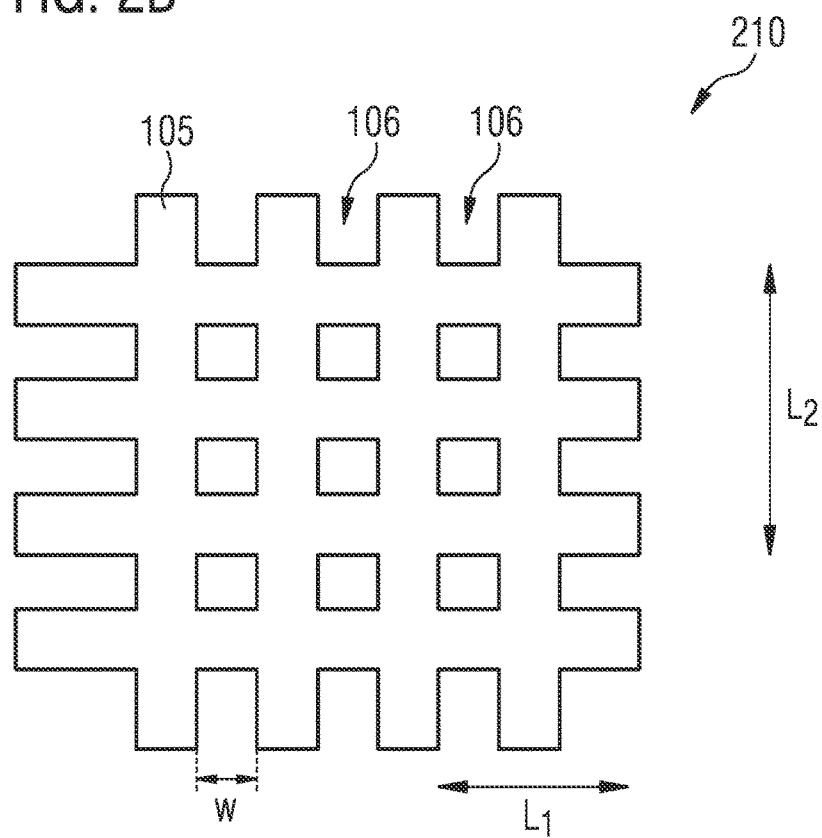
Figure 2C:
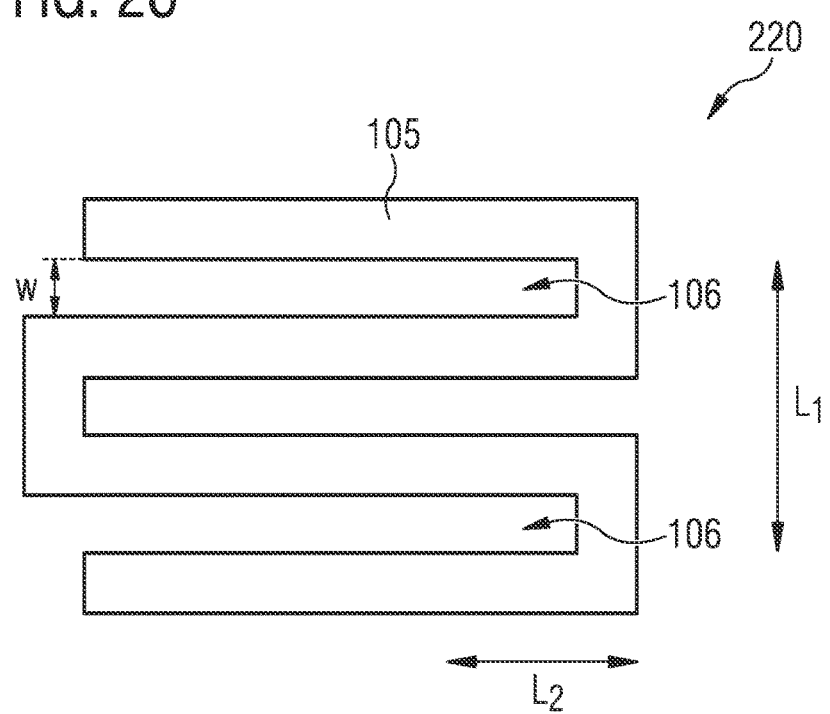

FIGS. 2A to 2C show top view illustrations of different variations of trench structures 106 of the semiconductor die 103. The examples in FIGS. 2A to 2C show that the one or more trench structures 106 have different outlines in a top view of the semiconductor die 103, but yet, may have a plurality of trenches 106 in the cross sectional side-view of the semiconductor die 103.

FIG. 2A shows a schematic illustration of a top view of a semiconductor device 200. The semiconductor device 200 may be similar to the semiconductor device 100. Semiconductor device 200 may include a plurality of individual line-shaped (column shaped) trench structures 106. Each trench structure 106 may include a line-shaped trench in a top view of the semiconductor die 103. Each line-shaped trench may have a lateral dimension (e.g. width, w) in the first lateral direction, L1. Additionally, a maximal lateral length, l, in the second lateral direction, L2 of each column-shaped trench may be more than 2× (or more than 5× or more than 10×) the maximal lateral width w.

FIG. 2B shows a schematic illustration of a top view of a semiconductor device 210. The semiconductor device 210 may be similar to the semiconductor device 100. The one or more trench structures 106 of the semiconductor device 200 may include (or may be) a grid-shaped trench structure 106. For example, the grid-shaped trench structure 106 may include a first group of substantially parallel line-shaped trenches formed perpendicular to a second group of substantially parallel line-shaped trenches.

FIG. 2C shows a schematic illustration of a top view of a semiconductor device 220. The semiconductor device 220 may be similar to the semiconductor device 100. The semiconductor device 220 may include one or more meandering trench structures including a plurality of bends (e.g. S-bends, or e.g. U-bends) in a top view of the semiconductor die 103.

More details and aspects are mentioned in connection with the examples described above or below. The examples shown in FIGS. 2A to 2C may each comprise one or more optional additional features corresponding to one or more aspects mentioned in connection with the proposed concept or one or more examples described above (e.g. FIGS. 1A to 1B) or below (FIGS. 3A to 7F).

Figure 3A:
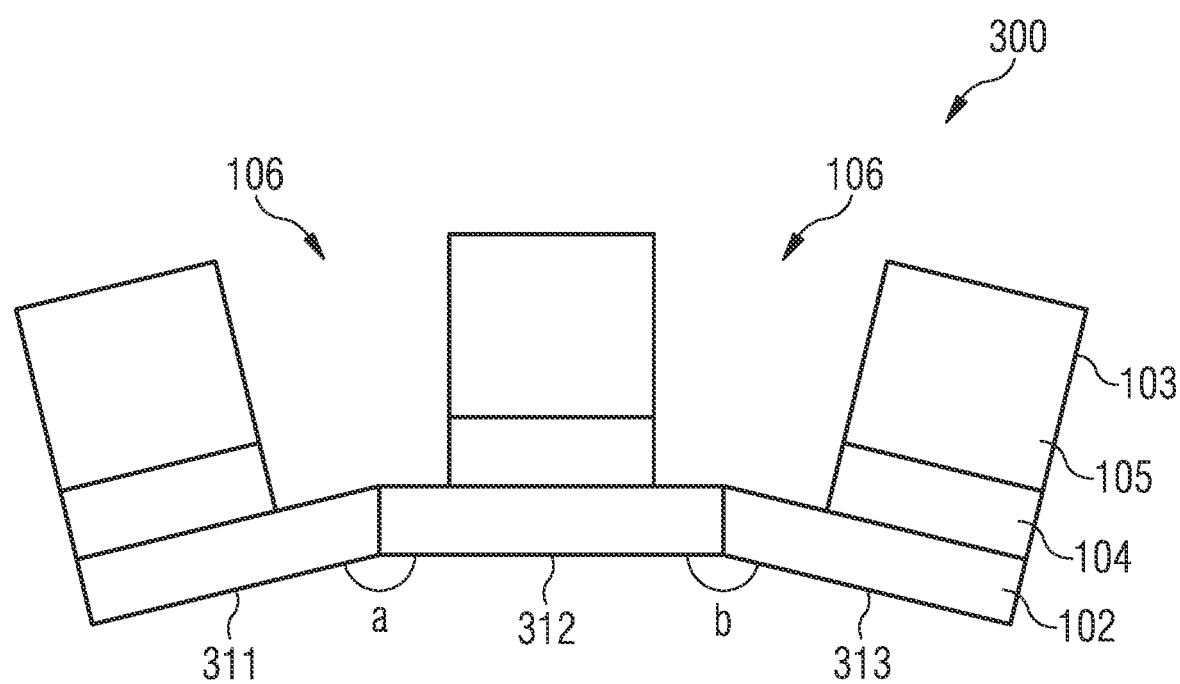
FIGS. 3A to 3B show various bendable configurations of a semiconductor device.
Figure 3B:
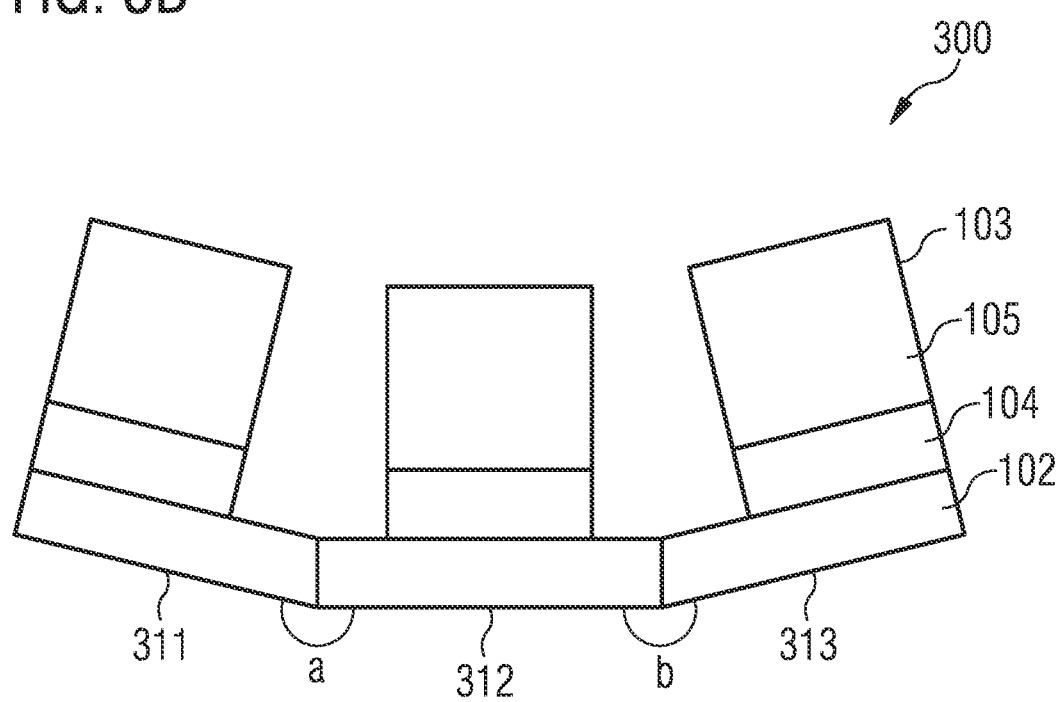

FIGS. 3A to 3B show schematic illustrations of a cross-sectional side view of a semiconductor device 300. For example, FIGS. 3A and 3B show possible bending configurations of the wafer with removed portions of the BOX layer.

As shown in FIGS. 3A and 3B, the plurality of trenches 106 of the one or more trench structures 106 of the semiconductor device 300 may be arranged so that the semiconductor die 103 is a bendable (flexible) semiconductor die 103. The one or more trench structures 106 may be filled with air, nitrogen or a noble gas, for example. Optionally, an elastic filler material may be arranged in the one or more trench structures so that the semiconductor die 103 would be bendable.

FIG. 3A shows that the bendable semiconductor die 103 of the semiconductor device 300 may be configured such that an angle, a, between a lateral surface of a first region 311 of the circuit semiconductor layer 102 and a lateral surface of a second region 312 of the circuit semiconductor layer 102 may be adjustable to less than 180°. Additional, an angle, b, between a lateral surface of the second region 312 of the circuit semiconductor layer 102 and a lateral surface of a third region of the circuit semiconductor layer 102 may be adjustable to less than 180°.

FIG. 3B shows that the angle, a, between the lateral surface of the first region 311 of the circuit semiconductor layer 102 and the lateral surface of the second region 312 of the circuit semiconductor layer 102 may be adjustable to more than 180°. Additionally, the angle, b, between the lateral surface of the second region 312 of the circuit semiconductor layer 102 and the lateral surface of the third region 313 of the circuit semiconductor layer 102 may be adjustable to more than 180°.

The bendable semiconductor die 103 may be configured so that each of angle a and angle b may be flexibly adjustable from less than 180° to more than 180°. Although FIGS. 3A and 3B show that the one or more trench structures 106 extend to the circuit semiconductor layer 102, it may be possible in other examples, that the one or more trench structures 106 may extend to the etch stop layer 104.

More details and aspects are mentioned in connection with the examples described above or below. The examples shown in FIGS. 3A to 3B may each comprise one or more optional additional features corresponding to one or more aspects mentioned in connection with the proposed concept or one or more examples described above (e.g. FIGS. 1A to 2C) or below (FIGS. 4 to 7F).

Figure 4:
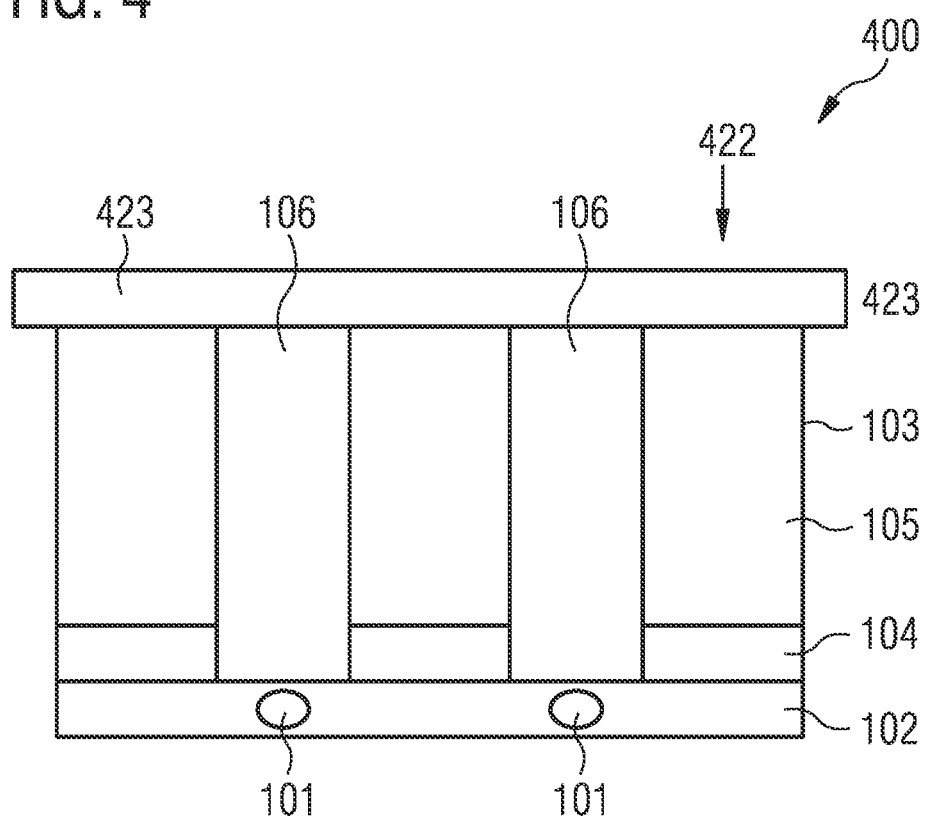
FIG. 4 shows a schematic illustration of a side view of a semiconductor device having a cover structure.

FIG. 4 shows a schematic illustration of a side view of a semiconductor device 400.

The semiconductor device 400 comprises a plurality of circuit regions 101 formed at a circuit semiconductor layer 102 of a semiconductor die 103. The semiconductor device 400 further comprises an etch stop layer 104 of the semiconductor die 103 arranged between the circuit semiconductor layer 102 of the semiconductor die 103 and a handling layer 105 of the semiconductor die 103. The semiconductor device 400 further comprises one or more trench structures 106 extending into the handling layer 105 from a back side 422 of the semiconductor die 103. The one or more of trench structures 106 are filled with gas or elastic material. The semiconductor device 400 further comprises a cover structure 423 arranged at the back side 422 of the semiconductor die 103 and covering the one or more trench structures 106.

Due to the one or more trench structures 106 being extending into the handling layer 105, the one or more trench structures 106 may alter the mechanical properties (e.g. bendability) of the semiconductor die 103. Thus, the one or more trench structures 106 may cause the semiconductor die 103 to be a bendable semiconductor die 103, thus increasing the range of applications in which the semiconductor die 103 may be implemented.

The one or more trench structures 106 may extend to at least the etch stop layer 104 and to at most the circuit semiconductor layer 102 of the semiconductor die 103. Additionally or optionally, the plurality of trenches 106 of the one or more trench structures 106 may be arranged so that the semiconductor die 103 is a bendable semiconductor die 103.

The cover structure 423 may be a flexible cover structure covering at least the opposite second surface of the semiconductor die 103. The flexible cover structure 423 may include or may be formed predominantly from an elastic material (e.g. an elastic rubber material). The cover structure 423 may be part of a package material which may protect the semiconductor die against impact and/or corrosion, and/or to dissipate the heat produced by the semiconductor device 400. Additionally or optionally, the semiconductor die 103 may be connected to a curved or flexible carrier substrate (e.g. a printed circuit board) which may be part of the semiconductor device 400. Additionally or optionally, the flexible cover structure 423 may be configured to bend simultaneously with the bendable semiconductor die 103 and the bendable flexible carrier substrate. The semiconductor device 400 may be at least one device selected from the following group of devices: a wearable device, a display device and a wearable display device.

More details and aspects are mentioned in connection with the examples described above or below. The examples shown in FIG. 4 may comprise one or more optional additional features corresponding to one or more aspects mentioned in connection with the proposed concept or one or more examples described above (e.g. FIGS. 1A to 3B) or below (FIGS. 5A to 7F).

FIGS. 5A and 5B show schematic illustrations of a semiconductor device 500. FIG. 5A shows a schematic illustration of a top view of the semiconductor device 500. The semiconductor device 500 may be a wearable device and/or a display device. For example, the semiconductor device 500 may include a fixed (e.g. non-flexible, or e.g. stiff) curved central portion (or unit) 514 and one or more flexible (bendable) wrist band portions 515.

FIG. 5B shows a schematic illustration of a cross-sectional side view of the semiconductor device 500. For example, the semiconductor device 500 may be a wearable device which may include silicon in varying bended configurations (e.g. a wrist band on the left) and a fixed bend configuration beneath the central portion 514).

The semiconductor device 500 may include a plurality of bendable semiconductor dies 103. At the wrist band portions 515 of the semiconductor device 500, a first group of flexible (bendable) semiconductor dies 103 may be connected to a flexible (bendable) carrier substrate 516 (e.g. a printed circuit board) of the wrist band portion 515. The flexible carrier substrate 516 may be configured to be bendable according to a user-directed configuration (e.g. according to the wearer of the device 500). The first group of one or more bendable semiconductor dies 103 may have a relatively large lateral dimension (length and/or breadth) in comparison to other semiconductor dies 517 with smaller lateral dimensions. For example, a minimal (or smallest) lateral dimension of the semiconductor die 103 may be larger than 1 mm (or e.g. larger than 5 mm, or e.g. larger than 10 mm). These larger components may need to be flexible in itself to ensure bendability, (e.g. such as in the wrist band portions, or e.g. in bendable portions of wearable rings), for example. The semiconductor dies 517 having smaller lateral dimensions (e.g. smaller than 5 mm in case of a wrist band) may be small stiff components which may be attached to the flexible carrier substrate 516, and do not harm overall bendability of the semiconductor device 500. The semiconductor device 500 may further include a flexible cover structure 518, which may cover at least the back surface and/or the sidewalls of the one or more flexible semiconductor dies 103. The flexible cover structure (e.g. which may be an elastic rubber material) may further cover (or embed) the other stiff semiconductor dies.

The central portion 514 (e.g. a curved display) of the semiconductor device 500 may include a partially curved rigid frame (e.g. a display frame) 519. A second carrier substrate 521 (e.g. a curved or flexible printed circuit board) may be mounted on (e.g. attached to) the curved frame 519. The semiconductor device 500 may include a second group of one or more bendable (flexible) semiconductor dies 103 which may be mounted on the second printed circuit board 521.

More details and aspects are mentioned in connection with the examples described above or below. The examples shown in FIGS. 5A to 5B may each comprise one or more optional additional features corresponding to one or more aspects mentioned in connection with the proposed concept or one or more examples described above (e.g. FIGS. 1A to 4) or below (FIGS. 6 to 7F).

FIG. 6 shows a method 600 for forming a semiconductor die. The method 600 comprises forming (in 610) a plurality of circuit regions at a circuit semiconductor layer of a semiconductor die. The method further comprises forming (in 620) one or more trench structures extending through a handling layer of the semiconductor die. The one or more trench structures extends to at least an etch stop layer of the semiconductor die and to at most a circuit semiconductor layer of the semiconductor die. The etch stop layer of the semiconductor die is arranged between the circuit semiconductor layer of the semiconductor die and a handling layer of the semiconductor die.

Due to the forming of the one or more trench structures extending to at least the etch stop layer 104 and to at most the circuit semiconductor layer 102 of the semiconductor die 103, a semiconductor device 100 with improved heat dissipation and/or improved bendability may be formed.

Forming the plurality of circuit regions at the circuit semiconductor layer may include forming circuit structures in the circuit semiconductor layer 102 of the semiconductor die 103. For example, forming the circuit structures may include forming (e.g. by implantation and/or diffusion) at least one p-n junction in the circuit semiconductor layer 102 of the semiconductor die. To form the at least on p-n junction, a body region of a transistor structure, at least one source or drain region of a transistor structure, at least one emitter or collector region of a transistor structure, and/or at least one anode or cathode region of a diode structure may be formed, for example. Forming the plurality of circuit regions may further include forming one or more metallization layers or electrical interconnects at the front side of the semiconductor die.

Forming the one or more trench structures may include forming a mask layer (resist) on the handling layer at the back side of the semiconductor die and forming one or more openings in the mask layer to expose portions of the handling layer at which the one or more trench structures are to be formed. The one or more trench structures may be formed by etching with an etchant the exposed portions of the handling layer.

More details and aspects are mentioned in connection with the examples described above or below. The examples shown in FIG. 6 may comprise one or more optional additional features corresponding to one or more aspects mentioned in connection with the proposed concept or one or more examples described above (e.g. FIGS. 1A to 5B) or below (FIGS. 7A to 7F).

FIGS. 7A to 7F show a schematic illustrations of a method 700 for forming a semiconductor die. The method 700 may be similar to the method 600 for forming the semiconductor die. For example, FIGS. 7A to 7F show a process flow how the structures building the heat sink may be generated.

Figure 7A:
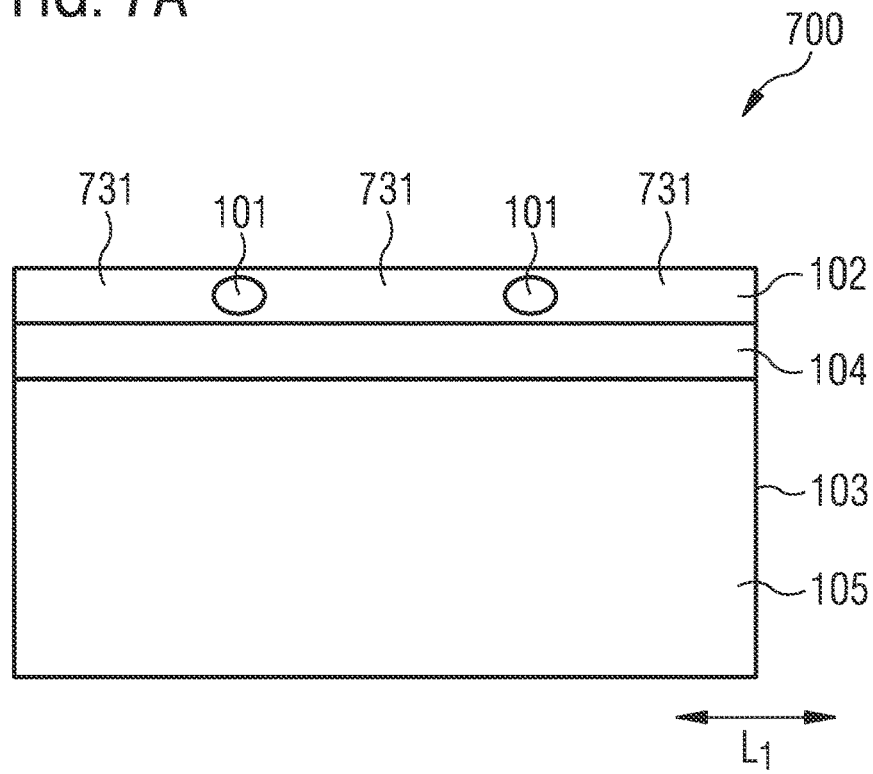
FIGS. 7A to 7F show schematic illustrations of a method for forming a semiconductor device.

As shown in FIG. 7A, the method 700 may include forming circuit structures in the circuit semiconductor layer 102 of the semiconductor die 103. The circuit structures may be formed in a plurality of circuit regions 101 at the circuit semiconductor layer 102 and/or in a plurality of intervening regions 731 of the circuit semiconductor layer 102. The circuit structures may be formed in the circuit semiconductor layer such that the circuit regions 101 of the plurality of circuit regions 101 may have a high (power) transistor density and the intervening regions 731 of the plurality of intervening regions 731 may have a low (power) transistor density. The plurality of circuits regions 101 of the circuit semiconductor layer 102 may be arrange laterally between intervening regions 731 of a plurality of intervening regions 731 of the circuit semiconductor layer 102. Additionally or optionally, the circuit structures may be formed in the circuit semiconductor layer such that the circuit regions of the plurality of circuit regions may be the regions of the circuit semiconductor layer conducting a high current density during an on-state of the semiconductor device to be formed. The intervening regions of the plurality of intervening regions may conduct a low current density during the on-state of the semiconductor device to be formed.

Figure 7B:
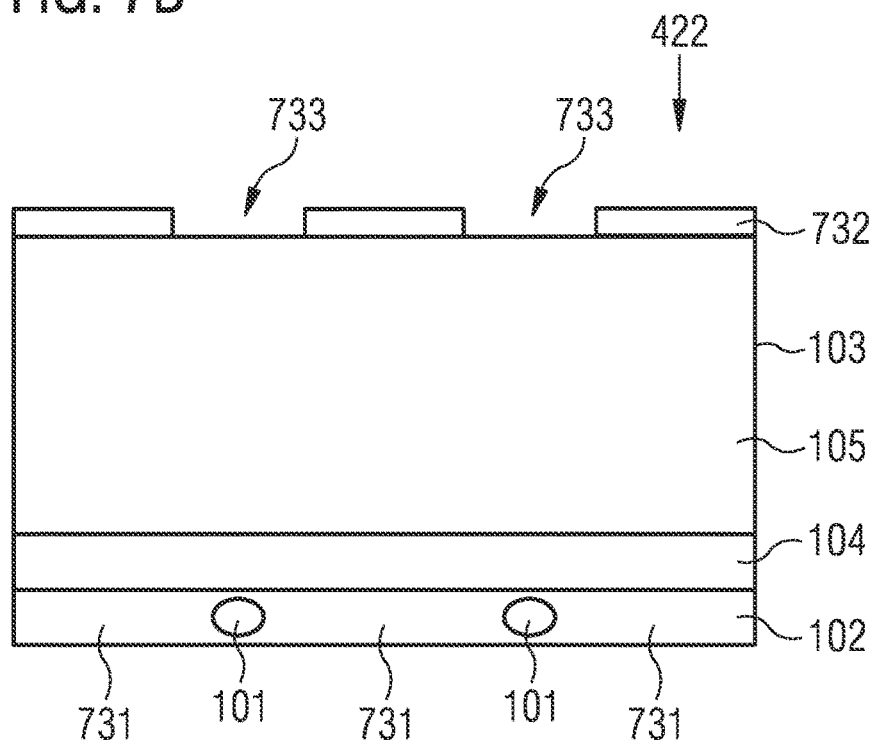

As shown in FIG. 7B, after forming the plurality of circuit regions, and optionally after back-grinding of the wafer backside, the method 700 may include forming a mask layer 732 (resist) on the back side 422 of the semiconductor die 103 and forming a one or more openings 733 in the mask layer 732 to expose portions of the handling layer 105 at which the one or more trench structures are to be formed. FIG. 7B shows the wafer backside covered with patterned resist. Possible resist opening patterns are similar to the patterns shown in FIGS. 2A to 2C. The resist 732 may be brought onto the silicon wafer backside (wafer is turned around), and structures may patterned into the resist with a photomask. Those structures may be e.g. lines of specified width and lengths, larger areas, two-dimensional line grids, and/or meanders.

Figure 7C:
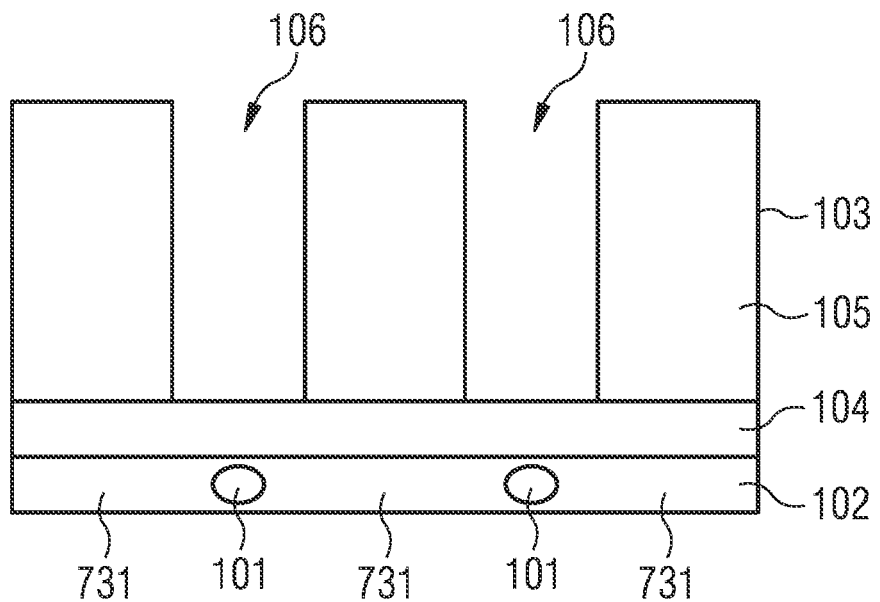

As shown in FIG. 7C, after forming the one or more openings 733 in the mask layer 732, the method 700 may further include forming one or more trench structures 106 in the handling layer 105. The one or more trench structures may be etched into the silicon by dry or wet etching all the way through to the wafer with the buried oxide as a distinct and very controlled etch stop, very close to the front surface of the wafer. The one or more trench structures 106 may include a plurality of trenches 106 in a cross section of the semiconductor die 103. The one or more trench structures 106 may be formed by etching the exposed portions of the handling layer 105. The etch stop layer 104 may be etch-resistant to the etchant used for etching the one or more trench structures 106 into the handling layer 105. For example, the handling layer 105 may be etched by the etchant at an etch rate of at least greater than 10 times (or e.g. greater than 15 times, or e.g. greater than 20 times) faster than etch stop layer 104. The one or more trench structures 106 may thus extend to the etch stop layer 104 (e.g. to an interface between the handling layer 105 and the etch stop layer 104). Optionally, the one or more trench structures 106 are not further etched to increased their depth beyond the interface between the handling layer 105 and the etch stop layer 104. FIG. 7C shows the wafer after etching of the silicon and optional resist stripping.

Figure 7D:
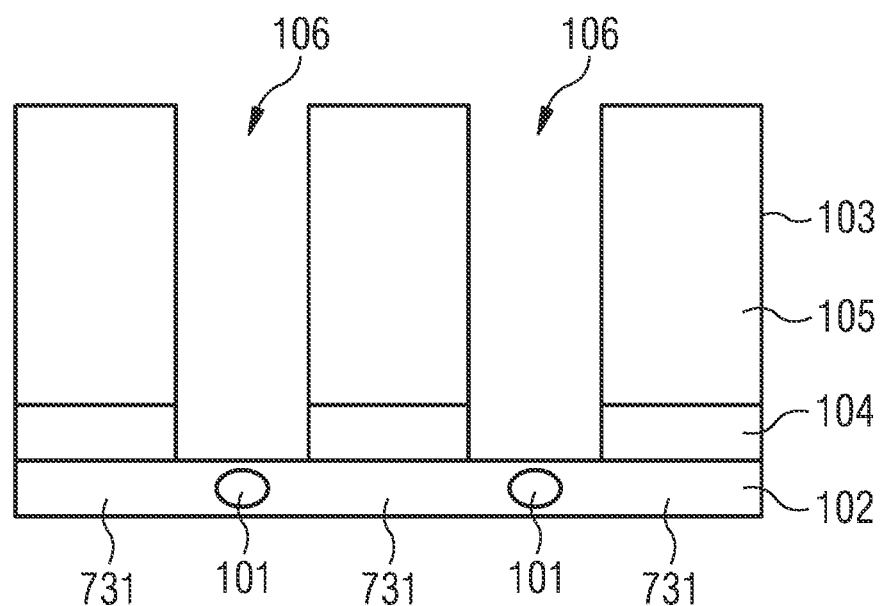

As shown in FIG. 7D, alternatively or optionally, the one or more trench structures 106 may be etched with a second (different) etchant so that the one or more trench structures 106 extend to the circuit semiconductor layer 102 (e.g. to an interface between the circuit semiconductor layer 102 and the etch stop layer 104). The circuit semiconductor layer 102 may be etch-resistant to the (second) etchant used for etching the one or more trench structures 106 into the etch stop layer 104. For example, the etch stop layer 104 may be etched by the second etchant at an etch rate of greater than 10 times (or e.g. greater than 15 times, or e.g. greater than 20 times) faster than circuit semiconductor layer 102. For example, the buried oxide 104 may be etched away using the backside of the top semiconductor layer 102 as an etch stop. In those areas only an ultrathin semiconductor film 102 is remaining. After forming the one or more trench structures 106, the resist may be stripped (or removed). FIG. 7D shows the wafer after etching of the BOX and optional resist stripping.

Optionally, the plurality of trenches 106 of the one or more trench structures 106 may be formed at locations in the handling layer 105 so that a bottom of each trench 106 of the plurality of trenches laterally overlaps a lateral area of a circuit region 101 of the plurality of circuit regions 101. The trenches 106 of the plurality of trenches 106 may be located between portions of the handling layer 105.

Figure 7E:
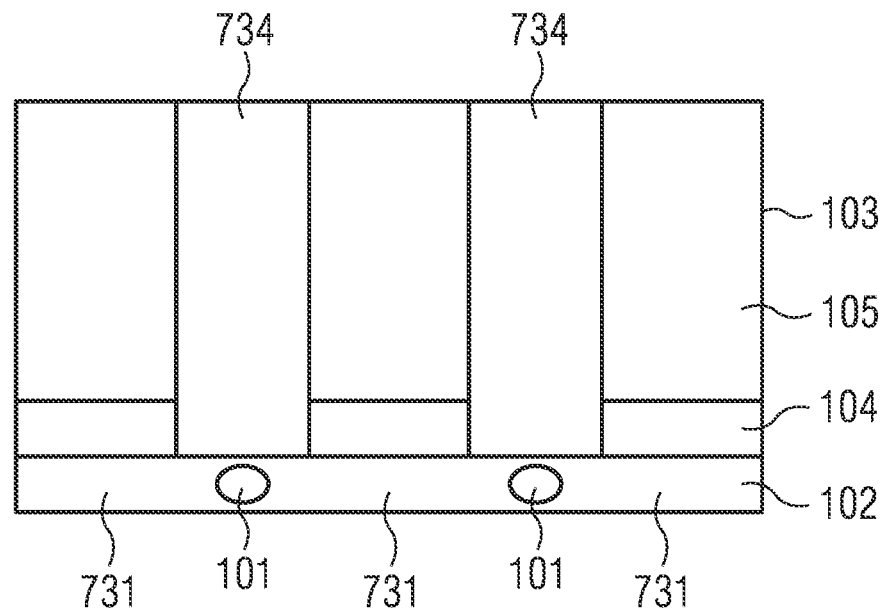
Figure 7F:
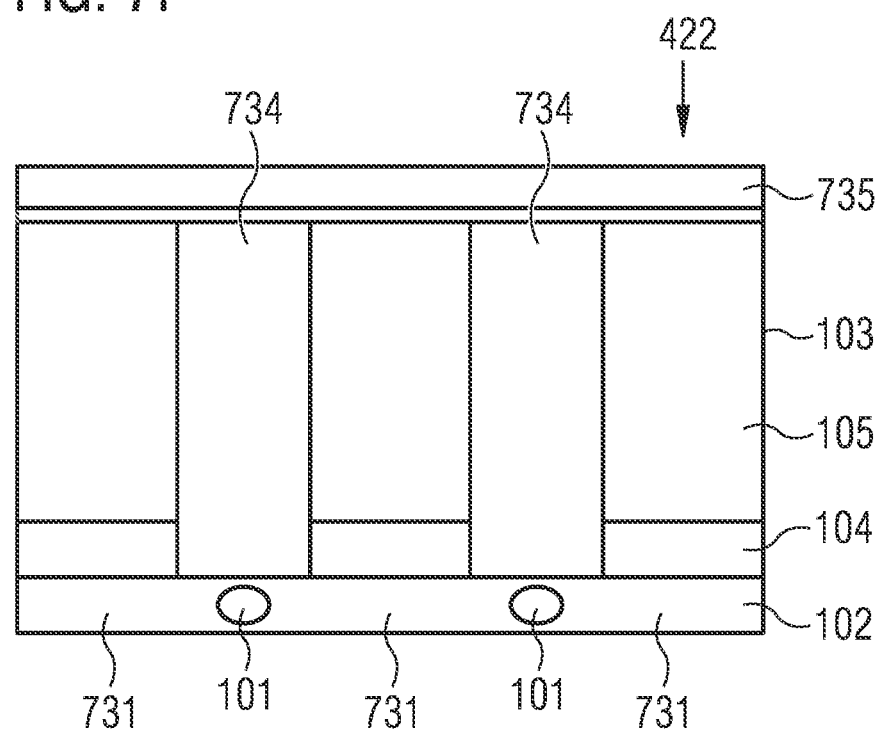

As shown in FIG. 7E, after forming the one or more trench structures 106, the one or more trench structures 106 may be filled with a thermally conductive filler material 734. The thermally conductive filler material 734 may include (or may be) a gas, a metal, or a liquid. A thermal conductivity of the thermally conductive filler material 734 may be at least 10 times (or e.g. at least 20 times) larger than a thermal conductivity of the handling layer 105.

In an example, the etched structures may be filled with a thermally highly conductive material 734 (e.g. a metal such as tungsten or copper). Optionally, a liner may be introduced before metal deposition if needed. Optionally as shown in FIG. 7F, the die backside may be metallized in addition also (with a metallization layer 735), to further improve heat dissipation. Alternatively or optionally, a liquid cooling system may be introduced in addition for enhanced heat dissipation.

Alternatively or optionally in another example usage of the semiconductor device, the generated structures from the wafer backside are not necessarily only used for heat dissipation, but for realizing an easily bendable die configuration. In this case the backside etched structures do not need to be realized underneath an electrical circuit for heat dissipation, but in between circuits to allow an extremely efficient bending of a die, if needed for an application, e.g. for wearables. For example, the structures might be left unfilled for optimum bendability or filled with soft elastic material for mechanical protection during bending. The buried oxide (insulator) might be etched away or left intact. Concave or convex curvature arrangements may be realized as shown in FIGS. 3A and 3B. The plurality of trenches 106 may be formed at locations in the handling layer 105 so that a bottom of each trench 106 of the plurality of trenches 106 laterally overlaps a lateral area of an intervening region 731 of the plurality of intervening regions 731. The one or more trench structures 106 may be left unfilled (e.g. filled with air for air cooling), or may be filled with nitrogen or a noble gas as shown in FIG. 7D. Optionally or alternatively, the method 700 may include arranging an elastic filler material 734 in the one or more trench structures 106. By filling the one or more trench structures 106 with a gas or an elastic filler material 734, the bendable semiconductor die 103 may be formed. Both FIGS. 7D and 7E show possibilities for utilizing the etched structures.

As shown in FIG. 7F, after filling the one or more trench structures 106 with thermally conductive filler material 734, the method 700 may further include forming a back side metallization layer 735 at (or on) the back side of the semiconductor die 103.

After forming the back side metallization layer 735 (and/or after further processing), and if a bendable semiconductor die 103 has been formed, the method 700 may further include connecting the bendable semiconductor die 103 to a surface of a curved or flexible carrier substrate. The die may be mounted in a stiff configuration, in a fixed bended configuration or in a flexible configuration which allows to change the bending configuration. In all these configurations mechanical stability of the entire arrangement may need to be ensured.

More details and aspects are mentioned in connection with the examples described above or below. The examples shown in FIGS. 7A to 7F may each comprise one or more optional additional features corresponding to one or more aspects mentioned in connection with the proposed concept or one or more examples described above (e.g. FIGS. 1A to 6) or below.

There may be a demand to provide concepts for improving heat dissipation in semiconductor devices. The various examples relate to a local backside metal structure for optimum heat dissipation. The various examples may be implemented in technologies and products using a semiconductor-on insulator (SOI) substrate as a base material and/or handling wafer. The various examples may be implemented in SOI technologies for RFFE purposes, for switches, power amplifiers (PA), lower noise amplifiers in 3G/4G/5G devices, for classical cellular frequencies as well as for mm-wave devices, for example. The various examples may be used for ultra-thin-body SOI technologies for digital/IoT (internet of things) applications, and/or for III/V technologies using an SOI handling wafer.

The aspects and features (e.g. the semiconductor die, the one or more trench structures, the handling layer, the etch stop layer, the circuit semiconductor layer, the circuit regions, the intervening regions, the thermally conductive filler material, the bendable semiconductor die, the wearable device) mentioned and described together with one or more of the previously detailed examples and figures, may as well be combined with one or more of the other examples in order to replace a like feature of the other example or in order to additionally introduce the feature to the other example.

In the following, examples pertain to further examples.

Example 1 is a semiconductor device, comprising: a plurality of circuit regions formed at a circuit semiconductor layer of a semiconductor die; an etch stop layer of the semiconductor die arranged between the circuit semiconductor layer of the semiconductor die and a handling layer of the semiconductor die; and one or more trench structures extending through the handling layer of the semiconductor die, wherein the one or more trench structures extends to at least the etch stop layer and to at most the circuit semiconductor layer of the semiconductor die.

In example 2, the subject matter of example 1 can optionally include a minimal lateral dimension of the one or more trench structures being larger than 1 μm.

In example 3, the subject matter of example 1 or 2 can optionally include a minimal depth of the one or more trench structures being larger than 50% of an average thickness of the semiconductor die.

In example 4, the subject matter of any of examples 1 to 3 can optionally include a minimal depth of the one or more trench structures being larger than 10 μm.

In example 5, the subject matter of any of examples 1 to 4 can optionally include a maximal thickness of the circuit semiconductor layer of the semiconductor die being less than 10 μm.

In example 6, the subject matter of any of examples 1 to 5 can optionally include the plurality of circuits regions of the circuit semiconductor layer being located between intervening regions of a plurality of intervening regions of the circuit semiconductor layer, wherein the circuit regions of the plurality of circuit regions have a high transistor density, and wherein the intervening regions of the plurality of intervening regions have a low transistor density.

In example 7, the subject matter of any of examples 1 to 6 can optionally include the plurality of circuits regions of the circuit semiconductor layer being located between intervening regions of a plurality of intervening regions of the circuit semiconductor layer, wherein the circuit regions of the plurality of circuit regions carries a high current density during an on-state of the semiconductor device, and wherein the intervening regions of the plurality of intervening regions carries a low current density during the on-state of the semiconductor device.

In example 8, the subject matter of any of examples 1 to 7 can optionally include the one or more trench structures comprising a plurality of trenches in a cross section of the semiconductor die, wherein the trenches of the plurality of trenches are located between portions of the handling layer.

In example 9, the subject matter of example 8 can optionally include the plurality of trenches of the one or more trench structures being arranged at locations in the handling layer corresponding to locations of the plurality of circuit regions at the circuit semiconductor layer of the semiconductor die.

In example 10, the subject matter of example 8 or 9 can optionally include the plurality of trenches being arranged at locations in the handling layer so that a bottom of each trench of the plurality of trenches laterally overlaps a lateral area of a circuit region of the plurality of circuit regions.

In example 11, the subject matter of example 10 can optionally include a vertical distance between a bottom of a trench and a gate of a transistor structure formed in a circuit region overlapping the trench being less than 1 μm.

In example 12, the subject matter of any of examples 9 to 11 can optionally include the number of trenches being at least half the number of plurality of circuit regions at the circuit semiconductor layer.

In example 13, the subject matter of any of examples 1 to 12 can optionally include thermally conductive filler material being arranged in the one or more trench structures, wherein a thermal conductivity of the thermally conductive filler material is at least 2 times larger than a thermal conductivity of the handling layer of the semiconductor die.

In example 14, the subject matter of example 13 can optionally include the thermally conductive filler material comprising a metal or a liquid.

In example 15, the subject matter of example 13 or 14 can optionally include a barrier layer arranged on sidewalls and a bottom of the one or more trench structures and a metal-based thermally conductive filler material arranged in the one or more trench structures.

In example 16, the subject matter of any of examples 13 to 15 can optionally include the thermally conductive filler material being a metal.

In example 17, the subject matter of example 14 or 15 can optionally include the thermally conductive filler material comprising water or an oil-based liquid.

In example 18, the subject matter of example 8 c an optionally include the plurality of trenches being arranged at locations in the handling layer corresponding to locations of the plurality of intervening regions at the circuit semiconductor layer of the semiconductor die.

In example 19, the subject matter of example 18 can optionally include the plurality of trenches being arranged at locations in the handling layer so that a bottom of each trench of the plurality of trenches laterally overlaps a lateral area of an intervening region of the plurality of intervening regions.

In example 20, the subject matter of example 18 or 19 can optionally include a minimal lateral dimension of the semiconductor die being larger than 0.5 mm.

In example 21, the subject matter of any of examples 18 to 20 can optionally include the number of trenches being at least half the number of plurality of intervening regions at the circuit semiconductor layer.

In example 22, the subject matter of any of examples 18 to 21 can optionally further include a flexible cover structure covering at least the back surface of the semiconductor die, wherein the one or more trench structures is filled with air, nitrogen or a noble gas.

In example 23, the subject matter of any of examples 18 to 21 can optionally further include a flexible cover structure covering at least the back surface of the semiconductor die, wherein an elastic filler material is arranged in the one or more trench structures.

In example 24, the subject matter of example 22 or 23 can optionally include the flexible cover structure comprising an elastic material.

In example 25, the subject matter of any of examples 18 to 24 can optionally further include a curved or flexible carrier substrate, wherein the semiconductor die is connected to a surface of the curved or flexible carrier substrate via a front surface of the semiconductor die.

In example 26, the subject matter of example 25 can optionally include the curved or flexible carrier substrate being a printed circuit board.

In example 27, the subject matter of example 25 or 26 can optionally further include a plurality of further semiconductor dies connected to the curved or flexible carrier substrate, wherein a flexible cover structure covers at least the back surfaces of the plurality of further semiconductor dies.

In example 28, the subject matter of any of examples 18 to 27 can optionally include the plurality of trenches of the one or more trench structures being arranged so that the semiconductor die is a bendable semiconductor die.

In example 29, the subject matter of example 28 can optionally include the bendable semiconductor die being configured such that an angle between a lateral surface of a first region of the circuit semiconductor layer and a lateral surface of a second region of the circuit semiconductor layer is adjustable from less than 180° to more than 180°.

In example 30, the subject matter of example 29 can optionally include the bendable semiconductor die being configured such that an angle between a lateral surface of the second region of the circuit semiconductor layer and a lateral surface of a third region of the circuit semiconductor layer is adjustable from less than 180° to more than 180°.

In example 31, the subject matter of any of examples 18 to 30 can optionally include the semiconductor device being at least one device selected from the following group of devices: a wearable device and a display device.

In example 32, the subject matter of any of examples 1 to 31 can optionally include the one or more trench structures comprising one or more trench structures selected from the group of trench structures consisting of: a line-shaped trench structure, a grid-shaped trench structure, and a meandering trench structure.

In example 33, the subject matter of any of examples 1 to 32 can optionally include the one or more trench structures extending from a back side of the semiconductor die towards the circuit semiconductor layer of the semiconductor die.

In example 34, the subject matter of any of examples 1 to 33 can optionally include the semiconductor die being a silicon-on-insulator (SOI) die.

Example 35 is a semiconductor device, comprising: a plurality of circuit regions formed at a circuit semiconductor layer of a semiconductor die; an etch stop layer of the semiconductor die arranged between the circuit semiconductor layer of the semiconductor die and a handling layer of the semiconductor die; and one or more trench structures extending into the handling layer from a back side of the semiconductor die, wherein the one or more trench structures are filled with gas or elastic material; and a cover structure arranged at the back side of the semiconductor die and covering the one or more trench structures.

In example 36, the subject matter of example 35 can optionally include the one or more trench structures extending to at least the etch stop layer and to at most the circuit semiconductor layer of the semiconductor die.

In example 37, the subject matter of example 35 or 36 can optionally include the one or more trench structures being arranged so that the semiconductor die is a bendable semiconductor die.

In example 38, the subject matter of any of examples 35 to 37 can optionally include the semiconductor die being connected to a curved or flexible carrier substrate.

In example 39, the subject matter of example 38 can optionally include the flexible carrier substrate being configured to be bendable according to a user-directed configuration.

In example 40, the subject matter of any of examples 35 to 39 can optionally include the semiconductor device being at least one device selected from the following group of devices: a wearable device, a display device and a wearable display device.

Example 41 is a method for forming a semiconductor die, the method comprising: forming a plurality of circuit regions at a circuit semiconductor layer of a semiconductor die; forming one or more trench structures extending through a handling layer of the semiconductor die, wherein the one or more trench structures extends to at least an etch stop layer of the semiconductor die and to at most a circuit semiconductor layer of the semiconductor die, wherein the etch stop layer of the semiconductor die is arranged between the circuit semiconductor layer of the semiconductor die and a handling layer of the semiconductor die.

In example 42, the subject matter of example 41 can optionally include the plurality of circuits regions of the circuit semiconductor layer are formed between intervening regions of a plurality of intervening regions of the circuit semiconductor layer, wherein the circuit regions of the plurality of circuit regions have a high transistor density, and wherein the intervening regions of the plurality of intervening regions have a low transistor density.

In example 43, the subject matter of example 41 or 42 can optionally include the one or more trench structures formed comprising a plurality of trenches in a cross section of the semiconductor die, wherein the trenches of the plurality of trenches are located between portions of the handling layer.

In example 44, the subject matter of any of examples 41 to 43 can optionally include the plurality of trenches being formed at locations in the handling layer so that a bottom of each trench of the plurality of trenches laterally overlaps a lateral area of an intervening region of the plurality of intervening regions.

In example 45, the subject matter of any of examples 41 to 44 can optionally further include arranging a thermally conductive filler material in the one or more trench structures, wherein the thermally conductive filler material comprises a gas or an elastic material.

In example 46, the subject matter of any of examples 41 to 45 can optionally further include connecting the semiconductor die to a surface of a curved or flexible carrier substrate after forming the plurality of trenches.

In example 47, the subject matter of any of examples 41 to 43 can optionally further include arranging a thermally conductive filler material in the one or more trench structures, wherein the thermally conductive filler material comprises a gas, a metal, or a liquid.

In example 48, the subject matter of example 42 can optionally include the plurality of trenches being formed at locations in the handling layer so that a bottom of each trench of the plurality of trenches laterally overlaps a lateral area of a circuit region of the plurality of circuit regions.

Example 49 is a machine readable storage medium including program code, which when executed, causes a machine to perform the method of any of examples 41 to 48.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor device, comprising:
   a plurality of circuit regions formed at a circuit semiconductor layer of a semiconductor die;
   an etch stop layer of the semiconductor die arranged between the circuit semiconductor layer of the semiconductor die and a handling layer of the semiconductor die; and
   one or more trench structures extending through the handling layer of the semiconductor die, wherein the one or more trench structures extends to at least the etch stop layer and to at most the circuit semiconductor layer of the semiconductor die wherein the plurality of circuits regions of the circuit semiconductor layer are located between intervening regions of a plurality of intervening regions of the circuit semiconductor layer, wherein the circuit regions of the plurality of circuit regions have a high transistor density, and wherein the intervening regions of the plurality of intervening regions have a low transistor density, wherein the one or more trench structures comprise a plurality of trenches in a cross section of the semiconductor die, wherein the trenches of the plurality of trenches are located between portions of the handling layer, wherein the plurality of trenches are arranged at locations in the handling layer so that a bottom of each trench of the plurality of trenches laterally overlaps a lateral area of a circuit region of the plurality of circuit regions.

2. The semiconductor device according to claim 1, wherein a minimal lateral dimension of the one or more trench structures is larger than 1 µm.

3. The semiconductor device according to claim 1, wherein a minimal depth of the one or more trench structures is larger than 50% of an average thickness of the semiconductor die.

4. The semiconductor device according to claim 1, wherein a minimal depth of the one or more trench structures is larger than 10 µm.

5. The semiconductor device according to claim 1, wherein a maximal thickness of the circuit semiconductor layer of the semiconductor die is less than 10 µm.

6. The semiconductor device according to claim 1, wherein the plurality of circuits regions of the circuit semiconductor layer are located between intervening regions of a plurality of intervening regions of the circuit semiconductor layer, wherein the circuit regions of the plurality of circuit regions carries a high current density during an on-state of the semiconductor device, and wherein the intervening regions of the plurality of intervening regions carries a low current density during the on-state of the semiconductor device.

7. The semiconductor device according to claim 1, wherein the plurality of trenches are arranged at locations in the handling layer corresponding to locations of the plurality of circuit regions at the circuit semiconductor layer of the semiconductor die.

8. The semiconductor device according to claim 1, wherein thermally conductive filler material is arranged in the one or more trench structures, wherein a thermal conductivity of the thermally conductive filler material is at least 2 times larger than a thermal conductivity of the handling layer of the semiconductor die.

9. The semiconductor device according to claim 8, wherein the thermally conductive filler material comprises a metal or a liquid.

10. The semiconductor device according to claim 1, wherein the semiconductor die is a silicon-on-insulator (SOI) die.

11. A semiconductor device, comprising:
a plurality of circuit regions formed at a circuit semiconductor layer of a semiconductor die;
an etch stop layer of the semiconductor die arranged between the circuit semiconductor layer of the semiconductor die and a handling layer of the semiconductor die; and one or more trench structures extending into the handling layer from a back side of the semiconductor die, wherein the one or more trench structures are filled with gas or elastic material; and a cover structure arranged at the back side of the semiconductor die and covering the one or more trench structures, wherein the plurality of circuits regions of the circuit semiconductor layer are located between intervening regions of a plurality of intervening regions of the circuit semiconductor layer, wherein the circuit regions of the plurality of circuit regions have a high transistor density, and wherein the intervening regions of the plurality of intervening regions have a low transistor density wherein the one or more trench structures comprise a plurality of trenches in a cross section of the semiconductor die, wherein the trenches of the plurality of trenches are located between portions of the handling layer, wherein the plurality of trenches are arranged at locations in the handling layer so that a bottom of each trench of the plurality of trenches laterally overlaps a lateral area of a circuit region of the plurality of circuit regions.

12. The semiconductor device according to claim 11, wherein the one or more trench structures extends to at least the etch stop layer and to at most the circuit semiconductor layer of the semiconductor die.

13. The semiconductor device according to claim 11, wherein the one or more trench structures are arranged so that the semiconductor die is a bendable semiconductor die.

14. A semiconductor device, comprising:
a plurality of circuit regions formed at a circuit semiconductor layer of a semiconductor die;
an etch stop layer of the semiconductor die arranged between the circuit semiconductor layer of the semiconductor die and a handling layer of the semiconductor die; and
one or more trench structures extending through the handling layer of the semiconductor die, wherein the one or more trench structures extends to at least the etch stop layer and to at most the circuit semiconductor layer of the semiconductor die wherein the plurality of circuits regions of the circuit semiconductor layer are located between intervening regions of a plurality of intervening regions of the circuit semiconductor layer, wherein the circuit regions of the plurality of circuit regions have a high transistor density, and wherein the intervening regions of the plurality of intervening regions have a low transistor density, wherein the one or more trench structures comprise a plurality of trenches in a cross section of the semiconductor die, wherein the trenches of the plurality of trenches are located between portions of the handling layer, wherein the plurality of trenches of the one or more trench structures are arranged at locations in the handling layer corresponding to locations of the plurality of intervening regions at the circuit semiconductor layer of the semiconductor die.

15. The semiconductor device according to claim 14, further comprising a flexible cover structure covering at least the back surface of the semiconductor die, wherein the one or more trench structures is filled with air, nitrogen or a noble gas.

16. The semiconductor device according to claim 15, further comprising a curved or flexible carrier substrate, wherein the semiconductor die is connected to a surface of the curved or flexible carrier substrate via a front surface of the semiconductor die.

17. The semiconductor device according to claim 14, further comprising a flexible cover structure covering at least the back surface of the semiconductor die, wherein an elastic filler material is arranged in the one or more trench structures.

18. The semiconductor device according to claim 14, wherein the plurality of trenches of the one or more trench structures are arranged so that the semiconductor die is a bendable semiconductor die.

19. The semiconductor device according to claim 14, wherein the semiconductor device is at least one device selected from the following group of devices: a wearable device and a display device.

* * * * *